United States Patent
Saito et al.

(10) Patent No.: US 7,554,155 B2
(45) Date of Patent: Jun. 30, 2009

(54) POWER SEMICONDUCTOR DEVICE AND METHOD OF MANUFACTURING THE SAME

(75) Inventors: Wataru Saito, Kawasaki (JP); Ichiro Omura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 473 days.

(21) Appl. No.: 11/250,441

(22) Filed: Oct. 17, 2005

(65) Prior Publication Data
US 2006/0157813 A1     Jul. 20, 2006

(30) Foreign Application Priority Data
Jan. 18, 2005 (JP) .............................. 2005-010480

(51) Int. Cl.
*H01L 29/00* (2006.01)
(52) U.S. Cl. ................... 257/341; 257/328; 257/329; 257/330; 257/110; 257/120; 257/E21.001
(58) Field of Classification Search ......... 257/328–330, 257/110, 120, 341, E21.001
See application file for complete search history.

(56) References Cited

U.S. PATENT DOCUMENTS

| | | | |
|---|---|---|---|
| 6,359,308 B1 * | 3/2002 | Hijzen et al. ................ | 257/341 |
| 6,639,260 B2 * | 10/2003 | Suzuki et al. ............... | 257/288 |
| 6,693,338 B2 | 2/2004 | Saitoh et al. | |
| 6,844,592 B2 | 1/2005 | Yamaguchi et al. | |
| 6,878,989 B2 * | 4/2005 | Izumisawa et al. .......... | 257/328 |
| 7,170,119 B2 * | 1/2007 | Yamauchi et al. ........... | 257/288 |
| 7,342,265 B2 * | 3/2008 | Kuwahara et al. .......... | 257/288 |

(Continued)

FOREIGN PATENT DOCUMENTS

JP          2001-168327          6/2001

(Continued)

OTHER PUBLICATIONS

U.S. Appl. No. 12/019,228, filed Jan. 24, 2008, Saito.
U.S. Appl. No. 12/020,288, filed Jan. 25, 2008, Saito, et al.

*Primary Examiner*—Eugene Lee
(74) *Attorney, Agent, or Firm*—Oblon, Spivak, McClelland, Maier & Neustadt, P.C.

(57) ABSTRACT

A power semiconductor device has a first main electrode formed along a surface of a substrate, a first semiconductor layer of first conductive type electrically connected to the first main electrode, a cyclic structure section which is formed on the first semiconductor layer and has second semiconductor layers of first conductive type and third semiconductor layers of second conductive type alternately and cyclically formed along the surface of the substrate, a fourth semiconductor layer of second conductive type selectively formed on a part of the second and third semiconductor layers, a fifth semiconductor layer of first conductive type selectively formed on the fourth semiconductor layer, a second main electrode contacted the fourth and fifth semiconductor layers, a control electrode disposed adjacent via a first insulating film on the second, fourth and fifth semiconductor layers, and a depletion layer blocking section which is formed outside of the cyclic structure section and prevents a depletion layer from spreading outside, wherein the depletion layer blocking section includes a conductive layer formed via a second insulating film in a first trench formed outside of the outermost third semiconductor layer in the cyclic structure section.

12 Claims, 8 Drawing Sheets

U.S. PATENT DOCUMENTS

2004/0016959 A1* 1/2004 Yamaguchi et al. ......... 257/327
2005/0077572 A1* 4/2005 Yamauchi et al. ........... 257/341
2006/0006386 A1* 1/2006 Hirler et al. .................. 257/60
2006/0157813 A1 7/2006 Saito et al.

FOREIGN PATENT DOCUMENTS

JP  2003-224276  8/2003

* cited by examiner

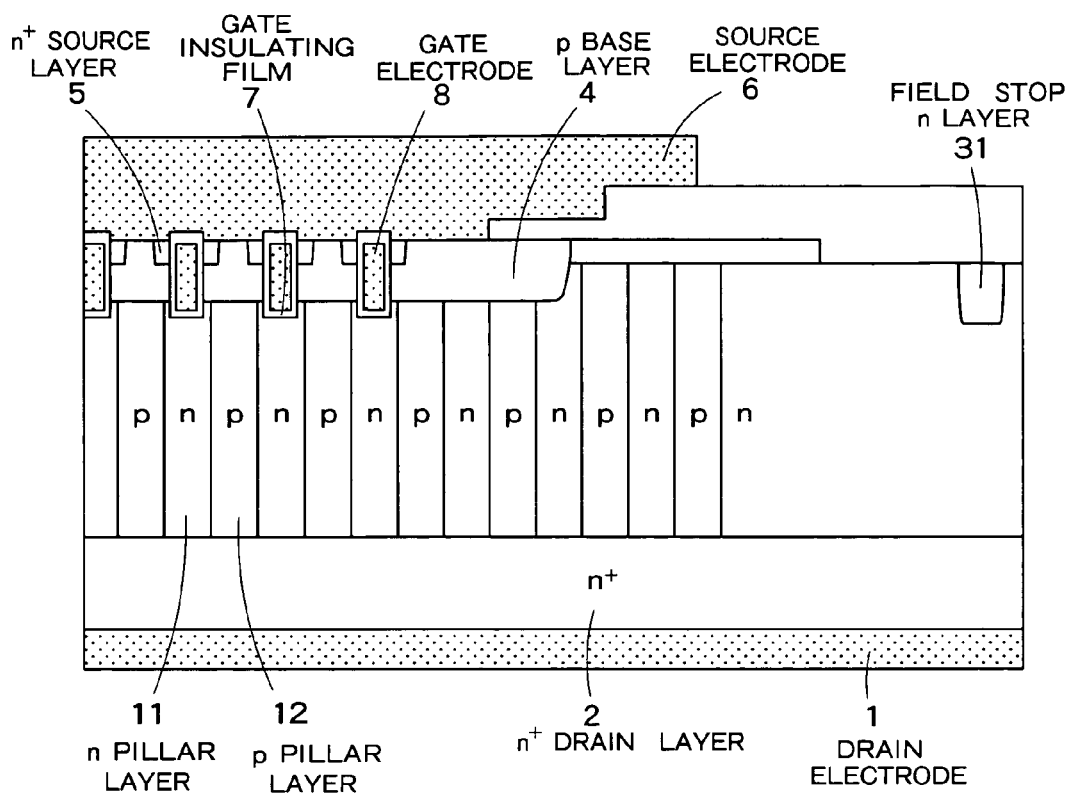
F I G. 4
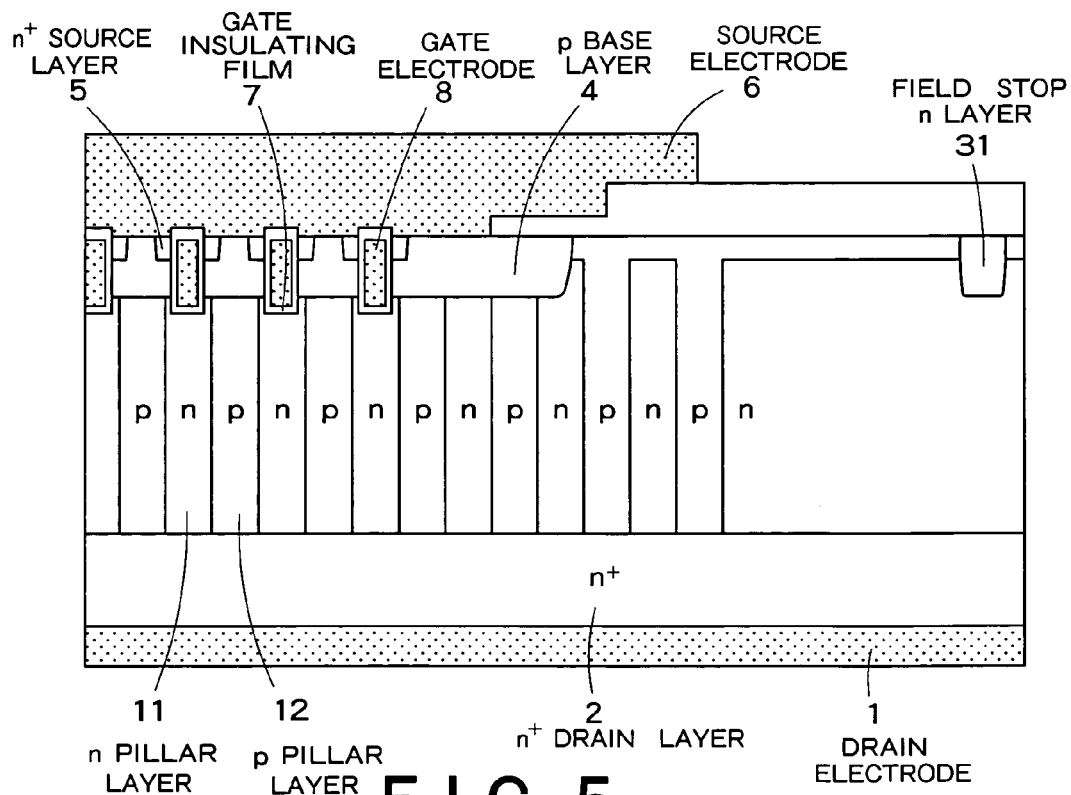
F I G. 5

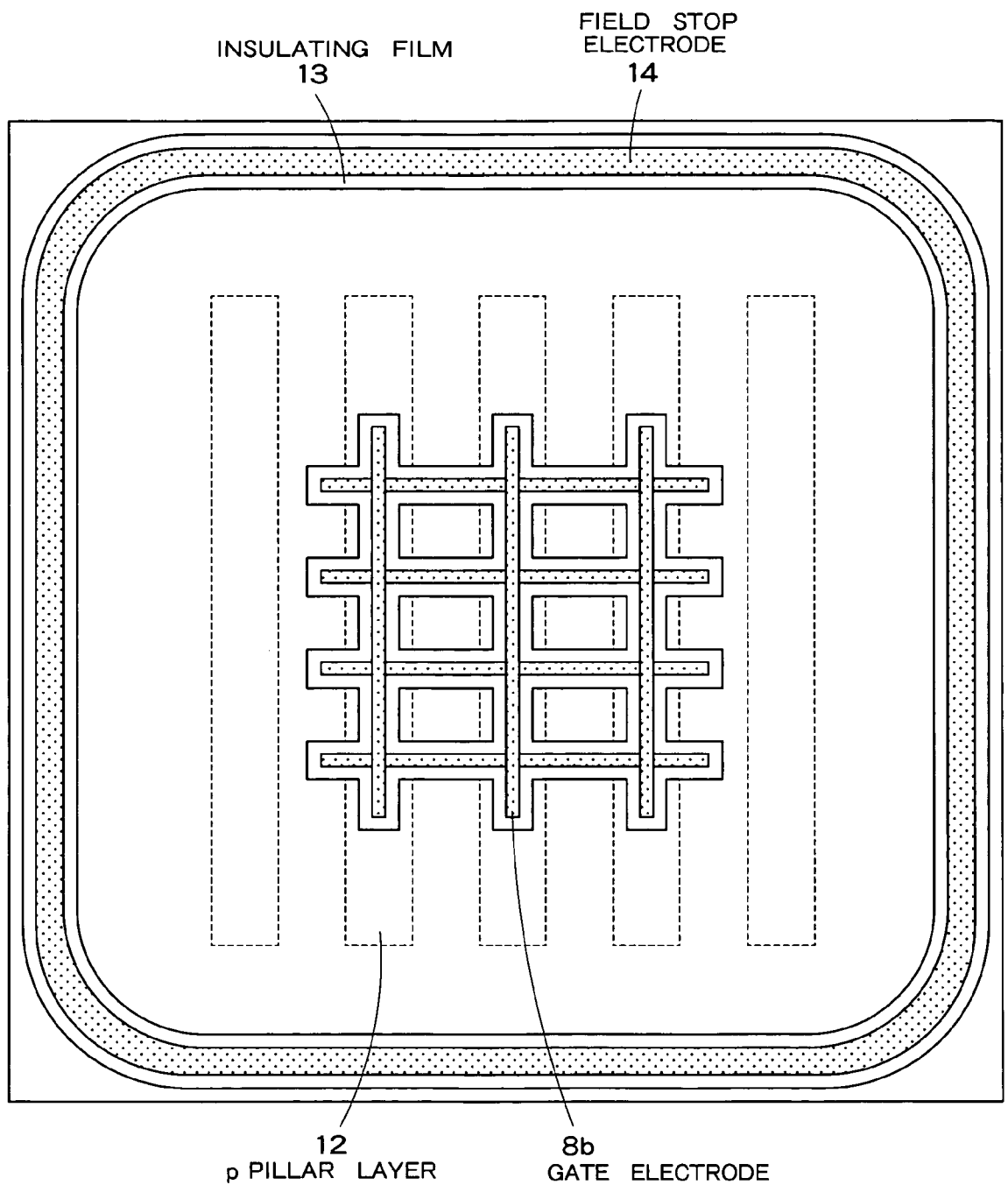
F I G. 9 ved excessively, taking etching variation into consideration. Therefore, the superjunction structure after the etching becomes thinner than that immediately after the embedded crystal growth, and the obtained maximum breakdown voltage is lowered.

POWER SEMICONDUCTOR DEVICE AND METHOD OF MANUFACTURING THE SAME

CROSS REFERENCE TO RELATED APPLICATIONS

This application is based upon and claims the benefit of priority from the prior Japanese Patent Application No. 2005-10480, filed on Jan. 18, 2005, the entire contents of which are incorporated herein by reference.

BACKGROUND OF THE INVENTION

1. Field of the Invention

The present invention relates to a power semiconductor device having a high voltage structure and a method of manufacturing the same.

2. Related Art

An ON resistance of a vertical power MOSFET greatly depends on an electric resistance of a conduction layer (drift layer). The electric resistance of the drift layer is determined by a doping concentration, which cannot be increased beyond a limit value that is determined by a breakdown voltage of a p-n junction formed by a base and a drift layer. Thus, there is a trade-off relationship between the breakdown voltage of the device and the ON resistance thereof. Therefore, it is important for a low-power-consumption device to optimize both the breakdown voltage and the ON resistance.

The breakdown voltage and the ON resistance each has a limitation that depends on materials of the device. In order to achieve a low ON resistance device superior to the existing power devices, it is essential to alleviate the limitations.

For example, as a MOSFET whose breakdown voltage and ON resistance are optimized, there has been proposed a MOSFET having the so-called superjunction structure which has p pillar layers and n pillar layers embedded in the drift layer. The superjunction structure has a pseudo non-doped layer formed by balancing the impurity concentration of the p pillar layers and that of the n pillar layers. This structure has a high breakdown voltage, and can achieve the ON resistance lower than the limitation depending on the material by flowing the current through the highly doped n pillar layers. The maximum breakdown voltage obtained by precisely controlling the amounts of the impurities in the n pillar layers and the p pillar layers is proportional to the thickness of the drift layer.

As a technique of forming such a superjunction structure, there is a method in which a trench groove is formed in an n-type epitaxial layer, and a p-type epitaxial layer is formed in the trench groove to fill the trench (see Japanese patent Laid-open publication No. 2003-273355). According to the technique, the trench groove having a high aspect ratio can be formed, so that a p pillar having a high aspect ratio can be formed. That is, it is possible to form the superjunction structure having narrow widths and deep trenches. The superjunction structure having narrow widths has a characteristic which tends to be completely depleted at a low voltage. Therefore, it is possible to increase the impurity concentration of the pillar, thereby achieving the low ON resistance. Since the breakdown voltage is proportional to the thickness of the drift layer, the above-mentioned superjunction structure can achieve a superior high-breakdown voltage performance.

As described above, a process combining trench groove formation and embedded crystal growth is effective in forming a superjunction MOSFET having a low ON resistance and a high breakdown voltage. A surface of the MOSFET formed by the process is covered with a p-type epitaxial layer. Therefore, in order to maintain a proper breakdown voltage, at least the p-type epitaxial layer on the surface at the edge of the device has to be removed. In order to surely remove the p-type epitaxial layer on the surface by etching or the like, the p-type epitaxial layer has to be etched excessively, taking etching variation into consideration. Therefore, the superjunction structure after the etching becomes thinner than that immediately after the embedded crystal growth, and the obtained maximum breakdown voltage is lowered.

SUMMARY OF THE INVENTION

A power semiconductor device according to one embodiment of the present invention, comprising:

a first main electrode formed along a surface of a substrate;

a first semiconductor layer of first conductive type electrically connected to the first main electrode;

a cyclic structure section which is formed on the first semiconductor layer and has second semiconductor layers of first conductive type and third semiconductor layers of second conductive type alternately and cyclically formed along the surface of the substrate;

a fourth semiconductor layer of second conductive type selectively formed on a part of the second and third semiconductor layers;

a fifth semiconductor layer of first conductive type selectively formed on the fourth semiconductor layer;

a second main electrode contacted the fourth and fifth semiconductor layers;

a control electrode disposed adjacent via a first insulating film on the second, fourth and fifth semiconductor layers; and a depletion layer blocking section which is formed outside of the cyclic structure section and prevents a depletion layer from spreading outside, wherein the depletion layer blocking section includes a conductive layer formed via a second insulating film in a first trench formed outside of the outermost third semiconductor layer in the cyclic structure section.

Furthermore, a method of manufacturing a power semiconductor device according to one embodiment of the present invention, comprising:

eliminating selectively from a substrate which has a first semiconductor layer of first conductive type and a second semiconductor layer of first conductive type formed on the first semiconductor layer, the second semiconductor layer, to form a plurality of first trenches;

forming a third semiconductor layer of second conductive type inside of the first trenches and on a surface of the second semiconductor layer;

forming a fourth semiconductor layer of second conductive type formed selectively on a part of the second semiconductor layer and a part of the third semiconductor layer;

forming a fifth semiconductor layer of first conductive type formed selectively on the fourth semiconductor layer;

forming a second trench which penetrates the fourth and fifth semiconductor layers, and has a depth reaching the second semiconductor layer;

filling a conductive material via an insulating film in the second and third trenches to form a gate electrode and a field stop electrode which prevents a depletion layer from spreading outside;

forming a first main electrode connected to the fourth and fifth semiconductor layers; and forming a second main electrode on a lower surface of the first semiconductor layer.

BRIEF DESCRIPTION OF THE DRAWINGS

FIG. 4 is a cross sectional view of a power MOSFET according to the second embodiment of the present invention.

FIG. 5 is a cross sectional view of a power MOSFET, which is a modification of the power MOSFET shown in FIG. 4.

FIG. 9 is a top view of a modification of the power MOSFET shown in FIG. 8.

DETAILED DESCRIPTION OF THE INVENTION

In the following, a power semiconductor device according to an embodiment of the present invention and a method of manufacturing the same will be described with reference to the drawings. In the following, a structure of a power MOSFET will be described as an example of a power semiconductor device according to the present invention.

First Embodiment

Figure 1:
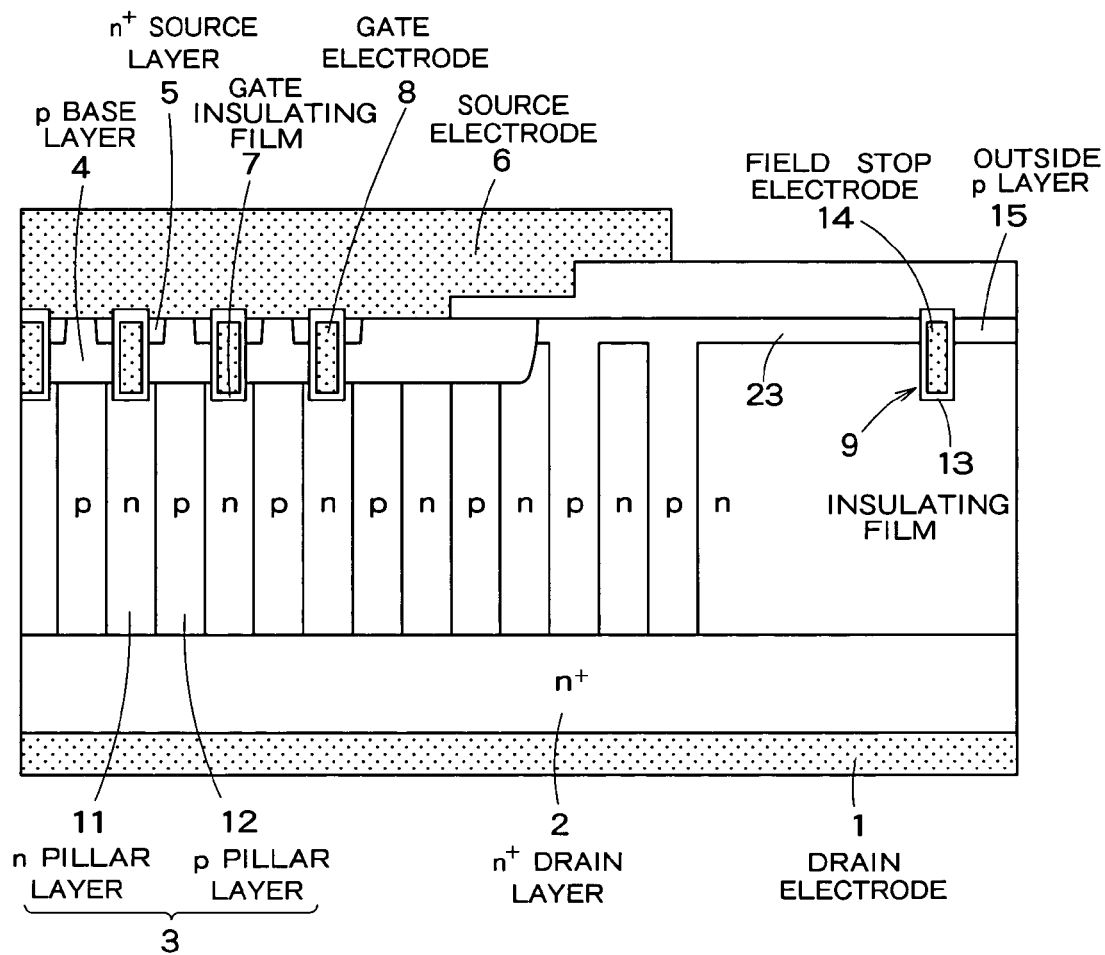
FIG. 1 is a cross sectional view of a power MOSFET according to an embodiment of the present invention.

FIG. 1 is a cross sectional view of a power MOSFET according to an embodiment of the present invention. The power MOSFET shown in FIG. 1 has a drain electrode 1 formed along a surface of a substrate, an n+drain layer 2 formed on the drain electrode 1, a drift layer 3 having a superjunction structure formed on the n+drain layer 2, a p base layer 4 selectively formed on a part of the drift layer 3, an n+ source layer 5 selectively formed on the p base layer 4, a source electrode 6 formed on the p base layer 4 and the n+ source layer 5, a gate electrode 8 disposed adjacent to the drift layer 3, the p base layer 4 and the n+ source layer 5 by sandwiching a gate insulating film 7 therebetween, and a depletion layer blocking section 9 which is formed at an end portion of the drift layer 3 and prevents spread of a depletion layer.

The drift layer 3 has an n pillar layer 11 and a p pillar layer 12 formed alternately and cyclically along a surface of the substrate. Gate electrodes 8 are formed on some n pillar layers 11 in stripes by sandwiching the gate insulating film 7 therebetween. The gate insulating film 7 is made of $SiO_2$ and has a thickness of 0.1 µm, for example. Source electrodes 6 are formed also in stripes above the p pillar layers 12. The source electrodes 6 are also disposed above the gate electrodes 8 via the gate insulating film 7.

A p-type epitaxial layer 23 extending from the drift layer 3 and an outer p layer 15 are formed on both sides of the depletion layer blocking section 9, respectively. The depletion layer blocking section 9 has a field stop electrode 14 that is disposed adjacent via an insulating layer 13 to the n pillar layer 11 located at the end of the substrate and the p-type epitaxial layer 23 formed thereon. The field stop electrode 14 may be in a floating state, that is, no voltage may be applied to the field stop electrode 14, or a voltage equal to that applied to the drain electrode 1 may be applied to the field stop electrode 14. Such a field stop electrode 14 can prevent any depletion layer from spreading outside, thereby preventing deterioration of the breakdown voltage and the reliability.

FIG. 2 shows steps in a process of manufacturing the power MOSFET shown in FIG. 1. First, an n-type epitaxial layer 21 is formed on an n+ drain layer 2, and then, a plurality of trench grooves 22 are formed in the n-type epitaxial layer 21 by photolithography or the like (FIG. 2A). Then, p-type epitaxial layers 23 are formed in the trench grooves 22 and on the surface of the substrate, and the surface of the substrate is planarized by chemical mechanical polishing (CMP) (FIG. 2B). The planarization is accomplished in such a manner that the p-type epitaxial layer 23 remains at the surface of the substrate. The step of planarizing the surface of the substrate may be omitted.

Conventionally, the p-type epitaxial layer 23 at the surface of the substrate has been completely removed. Therefore, by taking etching variations into consideration, the surface of the substrate had to be excessively polished. Therefore, there has been a problem that the drift layer 3 is thinned excessively, and the breakdown voltage decreases. Alternatively, by taking into consideration the planarization of the surface of the substrate, the drift layer 3 may be formed thicker than necessary in advance. In this case, however, there is a problem that the drift layer 3 has an excessive thickness, and the ON resistance increases.

To the contrary, according to this embodiment, the substrate planarization is accomplished in such a manner that the p-type epitaxial layer 23 remains at the surface of the substrate, so that the drift layer 3 is prevented from being thinned excessively. In addition, since there is no need to form the drift layer 3 thicker than needs in advance, there is no possibility that the resulting drift layer 3 is too thick.

Figure 2A:
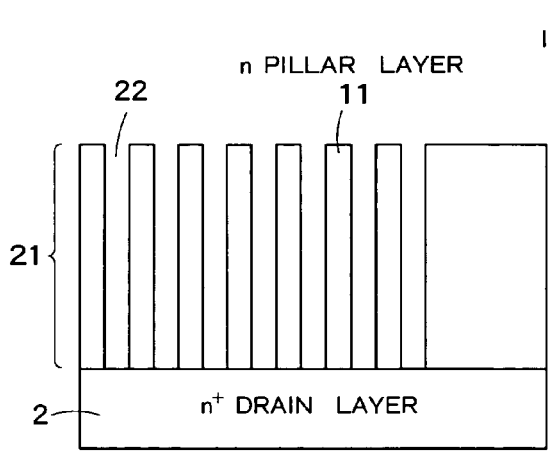
FIG. 2 shows steps in a process of manufacturing the power MOSFET shown in FIG. 1.
Figure 2D:
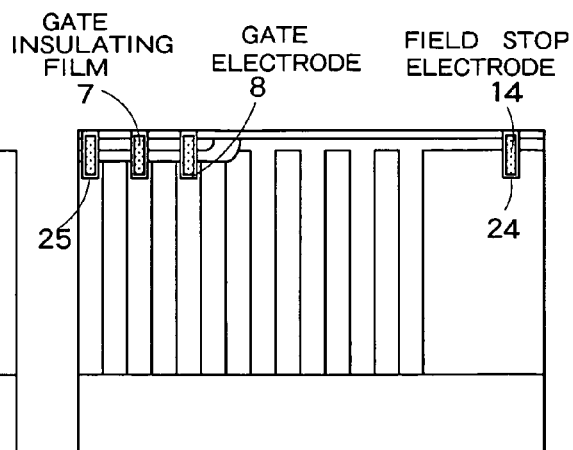
Figure 2B:
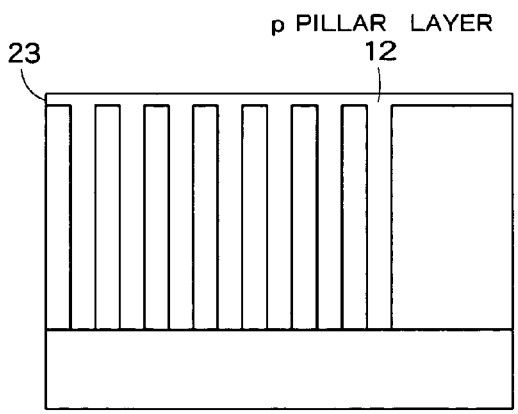
Figure 2E:
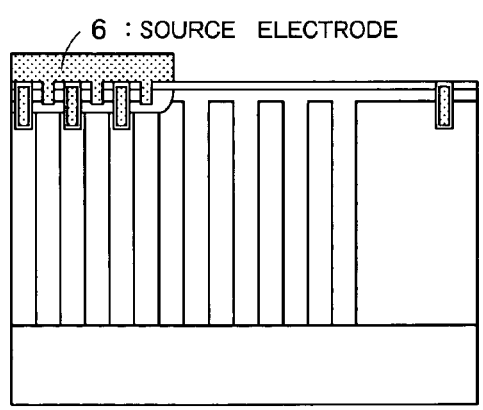
Figure 2C:
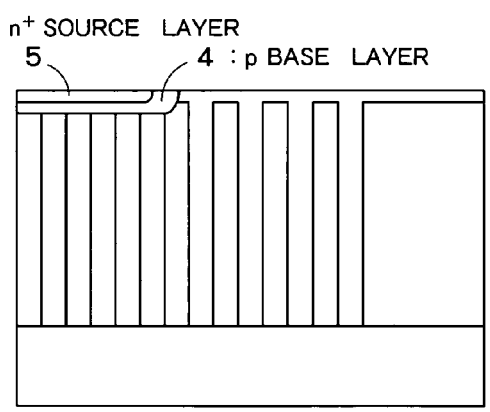

Once the planarization of the surface of the substrate is finished, a p base layer 4 is formed on a part of the drift layer 3, and an n+ source layer 5 is formed on the p base layer 4 (FIG. 2C). Then, a first trench 24 is formed at an region in which a depletion layer blocking section 9 is to be formed, and at the same time, a plurality of second trenches 25 are formed by removing the n+ source layer 5, the p base layer 4 and the n pillar layers 11. Then, these trenches are filled with a conductive material with an insulating film interposed between the inner surfaces of the trenches and the conductive material. In this way, gate electrodes 8 and a field stop electrode 14 are formed (FIG. 2D).

Then, the source electrodes 6 are formed in stripes adjacent to the gate electrodes 8, and an upper portion of the gate electrodes 8 is also covered with the source electrodes 6 via the insulating film (FIG. 2E).

Figure 2F:
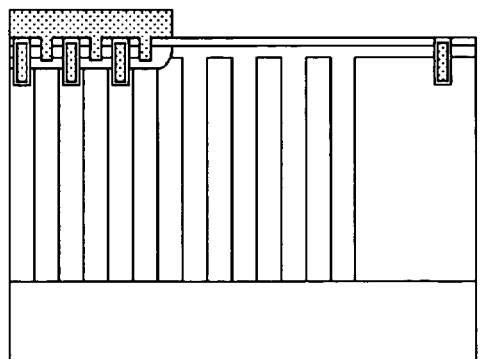

Then, a drain electrode 1, which is electrically connected to the n+ drain layer 2, is formed along the surface of the substrate opposite to the surface on which the source electrodes 6 are formed (FIG. 2F).

Figure 3:
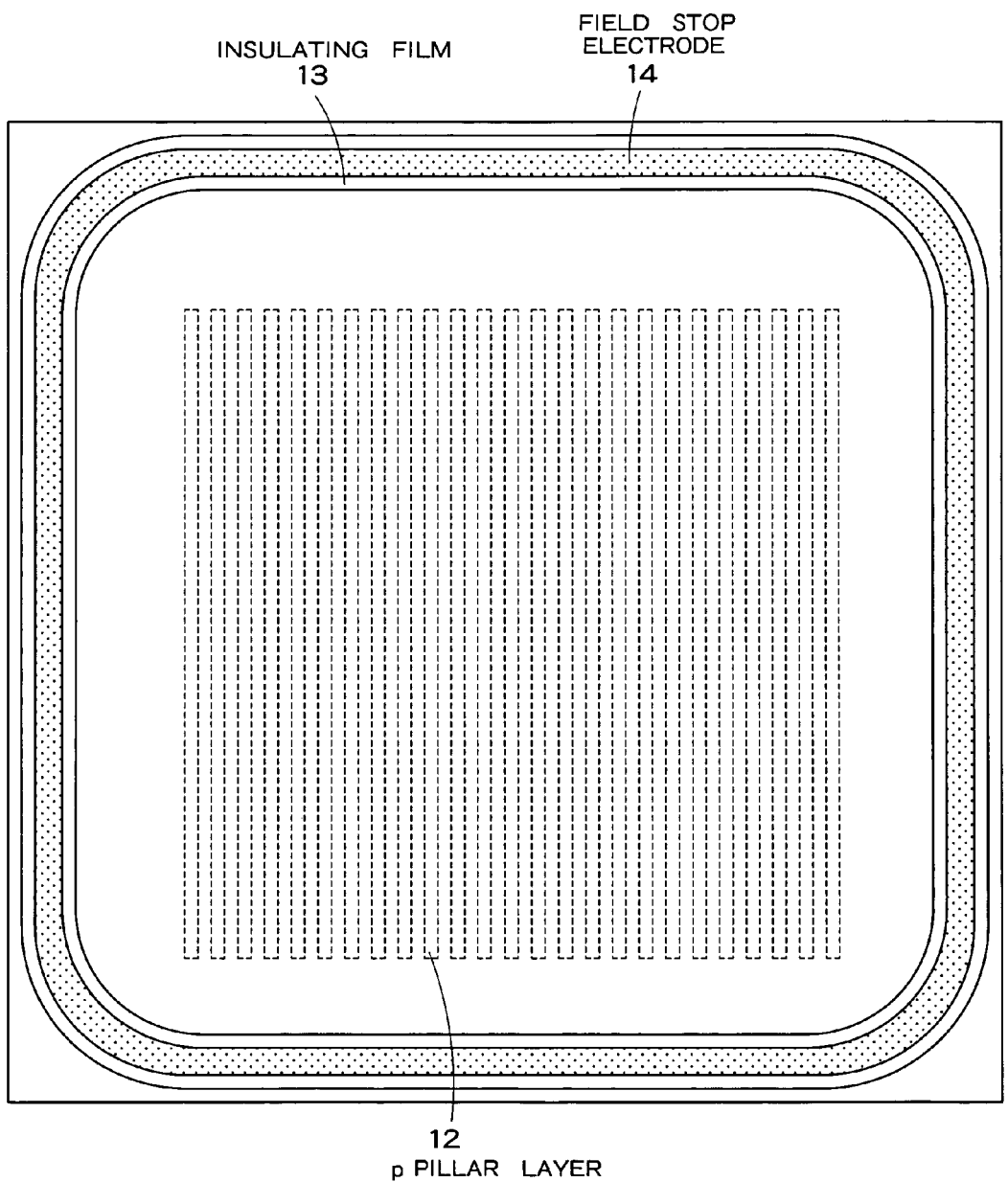
FIG. 3 is a top view of the power MOSFET according to this embodiment.

FIG. 3 is a top view of the power MOSFET according to this embodiment. As shown, the n pillar layers 11 and the p pillar layers 12 of the drift layer 3 are formed side by side in stripes. The field stop electrode 14 is formed along the circumference of the chip and surrounds the n pillar layers 11 and the p pillar layers 12.

As described above, according to the first embodiment, in forming the drift layer 3, the planarization is accomplished in such a manner that the p-type epitaxial layer 23 remains at the surface of the substrate. Therefore, the drift layer 3 is prevented from being excessively thinned, and thus, there is no possibility that the breakdown voltage decreases. In addition, there is no need to form the drift layer 3 thicker than needs in advance by taking into consideration the possibility of excessive planarization. Therefore, the resulting drift layer 3 is not too thick, and the ON resistance can be kept low. Furthermore, according to the first embodiment, the field stop electrode 14, which is formed close to the end of the substrate, can reliably prevent spread of the depletion layer. Therefore, even if any p-type epitaxial layer 23 extending from the drift layer 3 remains in the vicinity of the end of the substrate, there is no possibility that the breakdown voltage and the reliability are degraded.

Second Embodiment

A second embodiment is characterized in that the depletion layer blocking section 9 has a structure different from that according to the first embodiment.

FIG. 4 is a cross sectional view of a power MOSFET according to the second embodiment of the present invention. In FIG. 4, common components to those in FIG. 1 are denoted by the same reference numerals. In the following, differences from the first embodiment will be mainly described.

In the power MOSFET shown in FIG. 4, the p-type epitaxial layer 23 extends from the drift layer 3 toward the end of the substrate, and a part of the p-type epitaxial layer 23 close to the end of the substrate is eliminated. N-type impurity ions are implanted into the n-type epitaxial layer 21 at the end of the substrate where there is no p-type epitaxial layer 23, thereby forming a diffusion layer 31 (a field stop n layer). The diffusion layer 31 is equivalent to the depletion layer blocking section 9.

Since neither the p-type epitaxial layer 23 nor the outer p layer 15 exists around the diffusion layer 31, the depletion layer is hard to spread compared with the first embodiment. Besides, the diffusion layer 31 can surely prevent the depletion layer from spreading outward beyond the diffusion layer 31.

The power MOSFET shown in FIG. 4 requires an additional step of eliminating a part of the p-type epitaxial layer 23 close to the end of the substrate when forming the drift layer 3. However, the structure of the depletion layer blocking section 9 is simplified compared with that according to the first embodiment.

FIG. 5 is a cross sectional view of a power MOSFET, which is a modification of the power MOSFET shown in FIG. 4. In the power MOSFET shown in FIG. 5, the p-type epitaxial layer 23 extends to the end of the substrate as in the case shown in FIG. 1, and a deep diffusion layer 31 that reaches the n-type epitaxial layer 21 is formed at the end of the substrate. The diffusion layer 31 is equivalent to the depletion layer blocking section 9.

When the deep diffusion layer 31 shown in FIG. 5 is formed, impurity ions of the n pillar layers 11 and the p pillar layers 12 diffuse, and the effective impurity concentration decreases, thereby increasing the ON resistance. However, the diffusion layer 31 can prevent the depletion layer from spreading toward the end of the substrate, thereby improving the breakdown voltage.

As described above, according to the second embodiment, the diffusion layer 31 is formed at the end of the substrate, thereby preventing the depletion layer from spreading to the end of the substrate.

Third Embodiment

A third embodiment is a modification of the first embodiment and is characterized in that the p base layer 4 is thinner than the p-type epitaxial layer 23 in the surface of the substrate.

Figure 6:
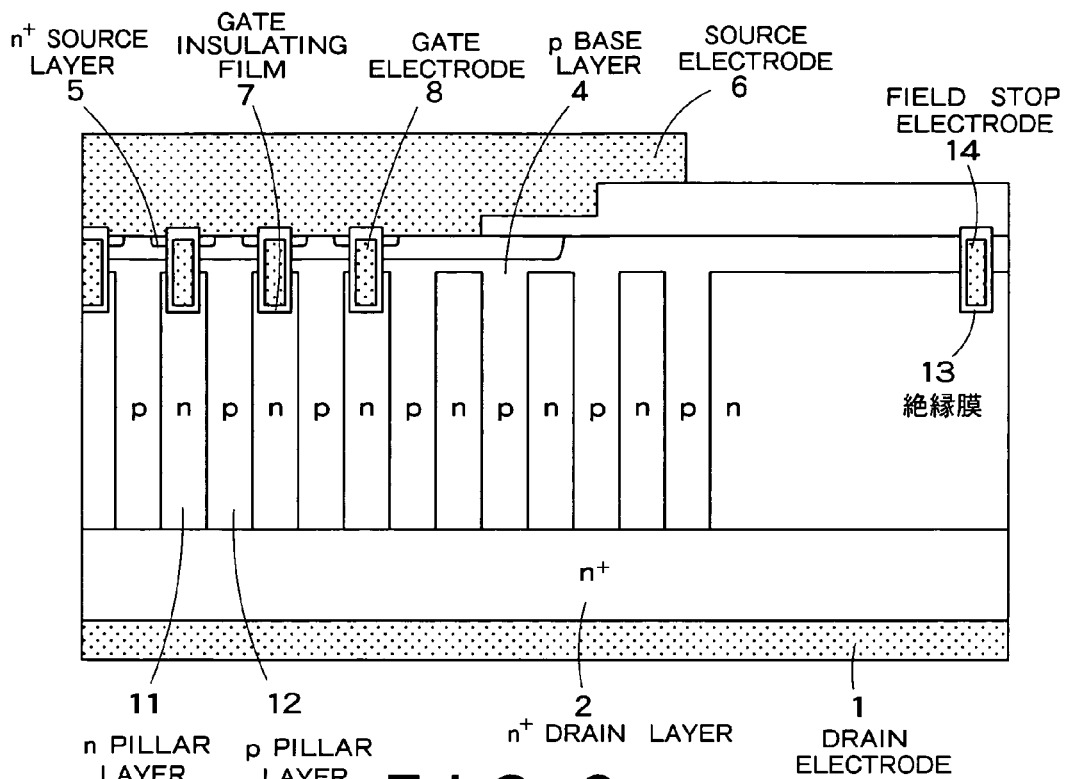
FIG. 6 is a cross sectional view of a power MOSFET according to the third embodiment of the present invention.

FIG. 6 is a cross sectional view of a power MOSFET according to the third embodiment of the present invention. Unlike the p base layer 4 of the power MOSFET shown in FIG. 1 that reaches the n pillar layers 11, a p base layer 4a shown in FIG. 6 does not reach the n pillar layers 11 and is located above the n pillar layers 11. That is, the p base layer 4a shown in FIG. 6 is considerably thinner than the p base layer 4 shown in FIG. 1.

Since the p base layer 4a is formed with a reduced thickness, the channel is shortened, the channel resistance is reduced, and consequently, the ON resistance is reduced. In addition, the thermal step involved in forming the p base layer 4a takes a shorter time, the impurity ions of the n pillar layers 11 and the p pillar layers 12 in the drift layer 3 are prevented from diffusing, and thus, the device performance is improved.

Although FIG. 6 and the like illustrates one example in which the p pillar layers 12 are in contact with the n+ drain layer 2, the p pillar layers 12 may not be in contact with the n+ drain layer 2.

Fourth Embodiment

A fourth embodiment is characterized in that a reduced surface field (RESURF) layer is formed between the p base layer 4 and the p-type epitaxial layer 23 located at the end of the surface of the substrate.

Figure 7:
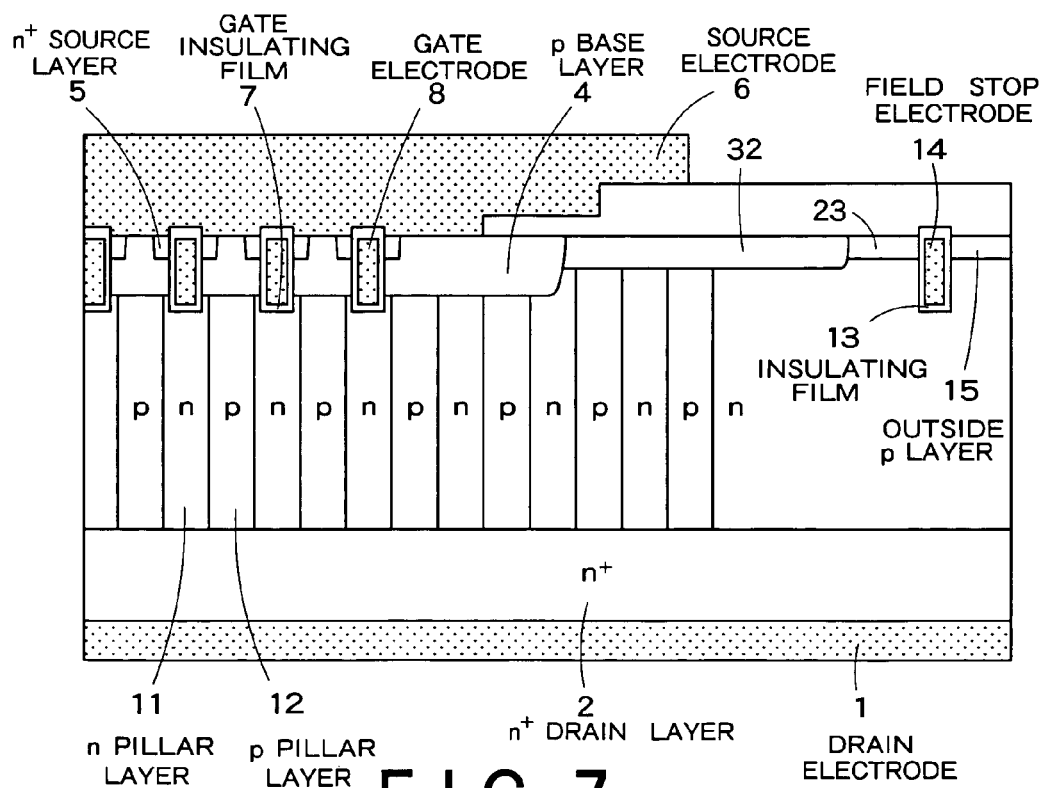
FIG. 7 is a cross sectional view of a power MOSFET according to the fourth embodiment of the present invention.

FIG. 7 is a cross sectional view of a power MOSFET according to the fourth embodiment of the present invention. The power MOSFET shown in FIG. 7 has a RESURF layer 32 between the p base layer 4 and the p-type epitaxial layer 23, which is located at the end of the surface of the substrate, and the other structures of the power MOSFET shown in FIG. 7 is the same as that shown in FIG. 1.

The RESURF layer 32 is formed by implantation of p-type impurity ions (for example, boron ions). The impurity ion concentration of the RESURF layer 32 is lower than the impurity ion concentration of the p base layer 4 and higher than the impurity ion concentration of the p-type epitaxial layer 23.

The breakdown voltage can be increased by providing such an RESURF layer 32.

Fifth Embodiment

A fifth embodiment is characterized in the arrangement of a gate electrode 8 and can be applied to the first to fourth embodiments described above.

Figure 8:
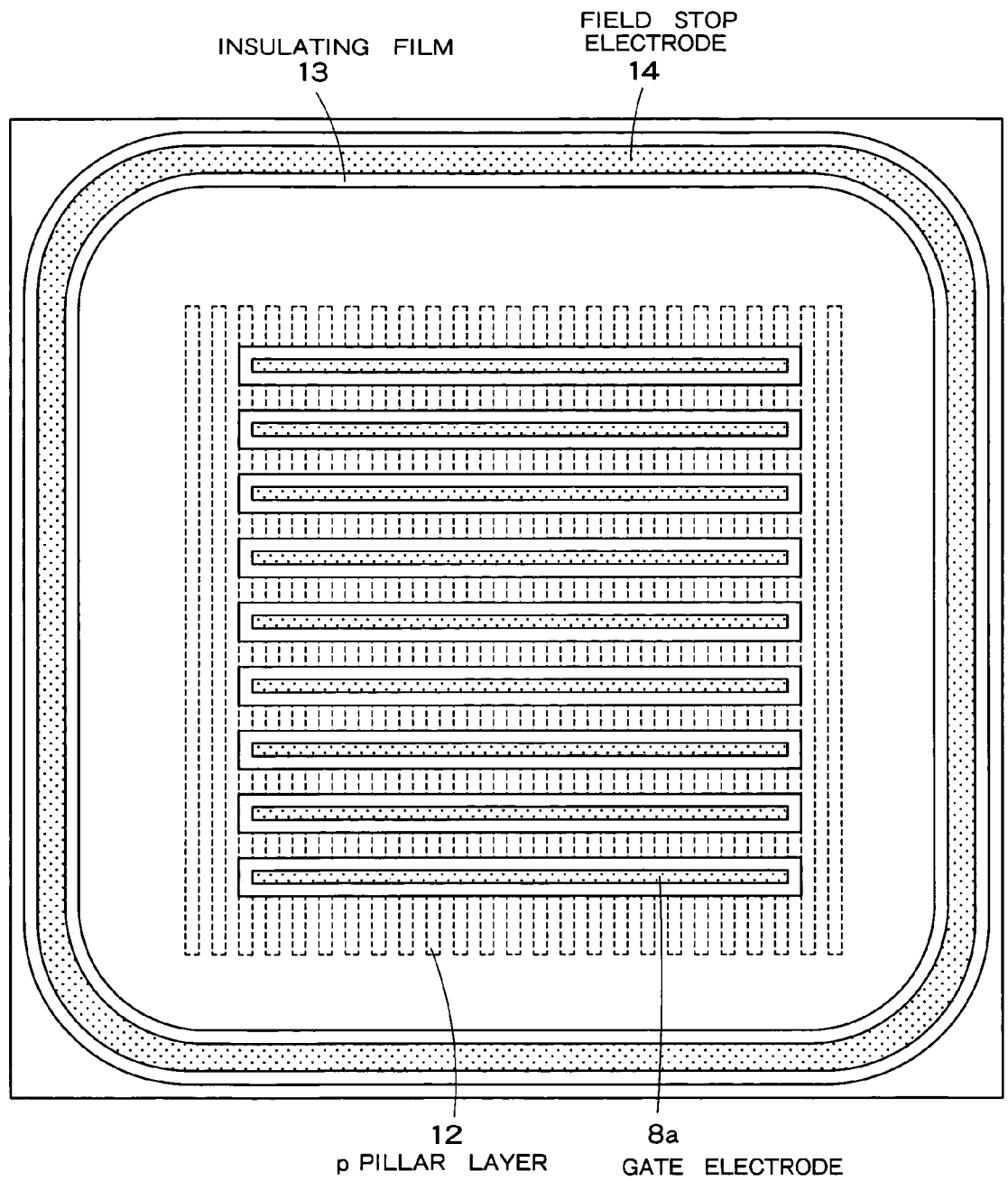
FIG. 8 is a top view of a power MOSFET according to the fifth embodiment of the present invention.

FIG. 8 is a top view of a power MOSFET according to the fifth embodiment of the present invention. Different from FIG. 3, the power MOSFET shown in FIG. 8 has a plurality of gate electrodes 8a formed in stripes at an angle of approximately 90° with respect to the longitudinal direction of the n pillar layers 11 and the p pillar layers 12.

In the case of the gate electrodes 8 in the structure shown in FIG. 3, since each of the gate electrodes 8 is formed in intervals between a plurality of p pillar layers 12 formed in stripes, the location flexibility in forming the gate electrodes 8 is limited, and the gate electrodes 8 have to be formed along the n pillar layers 11 and the p pillar layers 12 in the drift layer 3 of the superjunction structure. To the contrary, the gate electrodes 8a shown in FIG. 8 can be formed completely independently of a shape of the drift layer 3 of the superjunction structure. Accordingly, the manufacturing process can be simplified compared with the case shown in FIG. 3.

FIG. 9 is a top view of a modification of the power MOSFET shown in FIG. 8. The power MOSFET shown in FIG. 9 has gate electrodes 8b formed substantially perpendicular or parallel to the drift layer 3. In this case, a crystal defect primarily formed near the interface of the drift layer 3 is eliminated by the gate electrodes 8b, and the resultant power MOSFET is free of degradation of properties due to the crystal defect and is highly reliable.

Sixth Embodiment

A sixth embodiment is a modification of the first embodiment and is characterized in that a plurality of depletion layer blocking sections 9 are formed.

Figure 10:
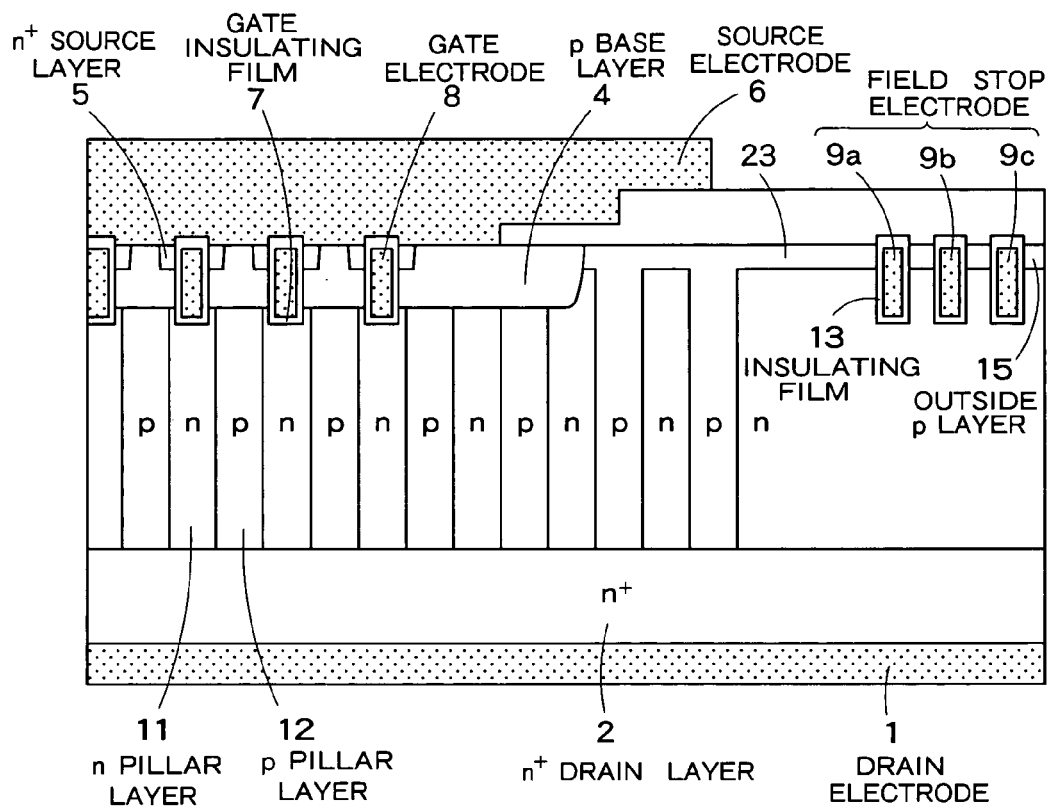
FIG. 10 is a cross sectional view of a power MOSFET according to the sixth embodiment of the present invention.

FIG. 10 is a cross sectional view of a power MOSFET according to the sixth embodiment of the present invention. The power MOSFET shown in FIG. 10 has three depletion layer blocking sections 9a, 9b and 9c spaced apart from each other. Each of the depletion layer blocking sections 9a, 9b and 9c has a field stop electrode 14 formed in the trench via an insulating film. The depletion layer blocking sections 9a, 9b and 9c serve to prevent a depletion layer from spreading. Therefore, for example, even if the depletion layer blocking section 9a closest to the drift layer 3 cannot adequately prevent a depletion layer from spreading, the spread of the depletion layer can be prevented completely by the outer two depletion layer blocking sections 9b and 9c.

Figure 11:
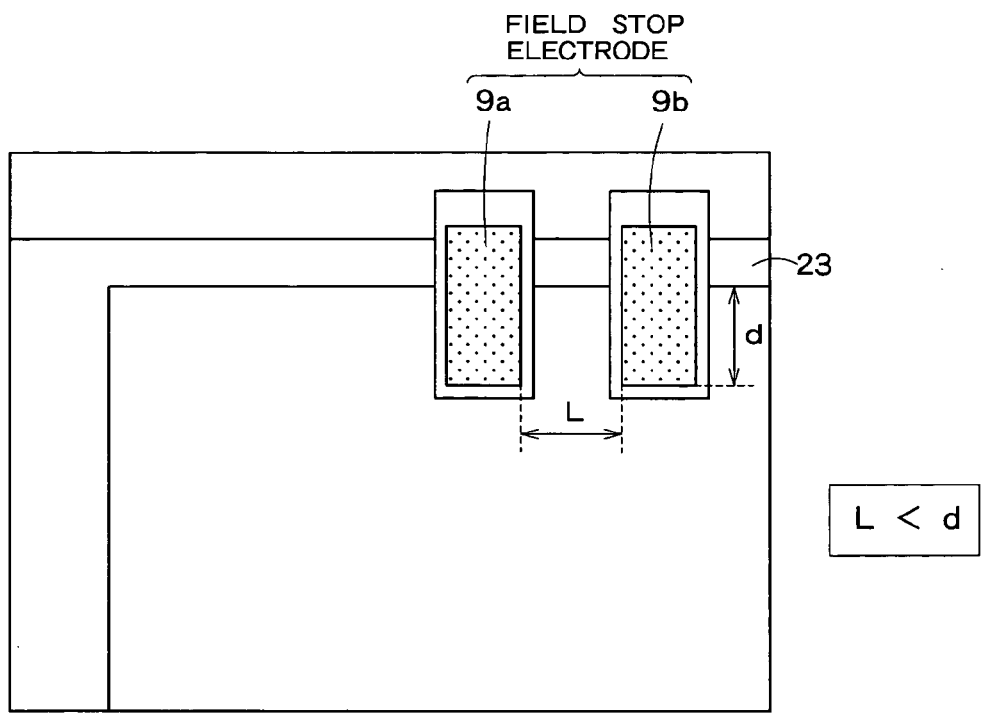
FIG. 11 shows a relationship between a distance L between the field stop electrodes 14 in adjacent two of the depletion layer blocking sections 9a, 9b and 9c and a depth d of each of the field stop electrodes 14.

FIG. 11 shows a relationship between a distance L between the field stop electrodes 14 in adjacent two of the depletion layer blocking sections 9a, 9b and 9c and a depth d of each of the field stop electrodes 14. As shown, a more stable breakdown voltage can be obtained when a relation of L<d is satisfied.

Other Embodiments

In the embodiments described above, a conductivity type of each layer may be inverted. That is, the p type may be replaced with the n type, and the n type may be replaced with the p type.

In addition, the shape of the gate electrodes 8 is not limited those shown in FIGS. 3, 4 and 9. Similarly, the n pillar layers 11 and the p pillar layers 12 of the drift layer 3 may not be always formed in stripes. The gate electrodes 8 or the drift layer 3 may be formed in a grid or staggered configuration.

In the embodiments described above, the material of the substrate of the power MOSFET may not be silicon. For example, a compound semiconductor such as silicon carbide (SiC) and gallium nitride (GaN), or a wide-band-gap semiconductor such as diamond, may be used.

In addition, in the embodiments described above, the present invention has been described by taking the MOSFET having the superjunction structure as an example. However, the present invention can be applied to various power semiconductor devices having the superjunction structure. For example, the present invention can be applied to an insulated-gate bipolar transistor (IGBT) or the like.

What is claimed is:

1. A power semiconductor device, comprising:
a first main electrode formed along one main surface;
a first semiconductor layer of first conductivity type electrically connected to the first main electrode;
a cyclic structure section which is formed on the first semiconductor layer and has second semiconductor layers of first conductivity type and third semiconductor layers of second conductivity type alternately and cyclically formed along the one main surface;
a fourth semiconductor layer of second conductivity type selectively formed on a part of the second and third semiconductor layers;
a fifth semiconductor layer of first conductivity type selectively formed on the fourth semiconductor layer;
a second main electrode contacted the fourth and fifth semiconductor layers;
a control electrode disposed adjacent via a first insulating film on the second, fourth and fifth semiconductor layers; and
a depletion layer blocking section which is formed outside of the cyclic structure section and prevents a depletion layer from spreading outside,
wherein the depletion layer blocking section includes a conductive layer formed via a second insulating film in a first trench formed outside of the outermost third semiconductor layer in the cyclic structure section, the depletion layer blocking section being electrically connected to the first main electrode or being in a floating state.

2. A power semiconductor device according to claim 1, wherein the outermost second semiconductor layer in the cyclic structure section is formed until the end of the substrate.

3. A power semiconductor device according to claim 1, further comprising a sixth semiconductor layer of second conductivity type which is made of the same material as that of the third semiconductor layer, and is formed to cover surfaces of the second and third semiconductor layers until an end of the substrate,
wherein the depletion layer blocking section penetrates the sixth semiconductor layer and is formed with a depth which reaches the second semiconductor layer.

4. A power semiconductor device according to claim 1, further comprising:
a sixth semiconductor layer of second conductivity type which is made of the same material as that of the third semiconductor layer, and is formed to cover surfaces of the second and third semiconductor layers until an end of the substrate; and
a seventh semiconductor layer of second conductivity type which is formed between the fourth semiconductor layer and the sixth semiconductor layer, and has impurity concentration lower than that of the fourth semiconductor layer.

5. A power semiconductor device according to claim 1, further comprising:
a sixth semiconductor layer of second conductivity type which is made of the same material as that of the third semiconductor layer, and is formed to cover surfaces of the second and third semiconductor layers until an end of the substrate; and
wherein the fourth semiconductor layer is formed in the third semiconductor layer located more upward than the second semiconductor layer.

6. A power semiconductor device according to claim 1, wherein the first insulating film and the control electrode are formed in a second trench with the same depth as that of the first trench formed in the second, fourth and fifth semiconductor layers.

7. A power semiconductor device according to claim 1, wherein the depletion layer blocking section is formed to enclose the cyclic structure section.

8. A power semiconductor device according to claim 7, wherein the cyclic structure section is formed in stripes in a first direction on the surface of the substrate; and
the control electrode is formed in the first direction along a cyclic structure in the cyclic structure section.

9. A power semiconductor device according to claim 7, wherein the cyclic structure section is formed in stripes in a first direction on the surface of the substrate; and
the control electrode is formed in a second direction different from the first direction on the surface of the substrate.

10. A power semiconductor device according to claim 7, wherein the cyclic structure section is formed in stripes in a first direction on the surface of the substrate; and the control electrode is formed in the first direction along a cyclic structure of the cyclic structure section, and is formed in the second direction different from the first direction.

11. A power semiconductor device according to claim 1, wherein a plurality of depletion layer blocking sections are formed separate from each other from a side near the cyclic structure section to an end of the substrate.

12. A power semiconductor device according to claim 11, further comprising a sixth semiconductor layer of second conductivity type which is made of the same material as that of the third semiconductor layer, and is formed to cover surfaces of the second and third semiconductor layers until the end of the substrate,
wherein the depletion layer blocking section has a conductive layer formed via the second insulating film in the first trench; and
a distance between adjacent two depletion layer blocking sections is shorter than a length from a lower surface of the sixth semiconductor layer to a lower surface of the conductive layer.

* * * * *